United States Patent
Kamiya et al.

(10) Patent No.: US 7,491,772 B2
(45) Date of Patent: Feb. 17, 2009

(54) REMOVABLE WATER-DISPERSIBLE ACRYLIC ADHESIVE COMPOSITION AND ADHESIVE SHEET

(75) Inventors: Katsuhiko Kamiya, Ibaraki (JP); Tomonari Naito, Ibaraki (JP); Satomi Yoshie, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/643,764

(22) Filed: Dec. 22, 2006

(65) Prior Publication Data

US 2007/0148444 A1 Jun. 28, 2007

(30) Foreign Application Priority Data

Dec. 22, 2005 (JP) ............................. 2005-370230
Dec. 27, 2005 (JP) ............................. 2005-374553

(51) Int. Cl.
*C08C 19/22* (2006.01)
*C08C 19/30* (2006.01)

(52) U.S. Cl. .............. 525/330.3; 525/329.7; 525/330.5; 525/374; 428/500

(58) Field of Classification Search .............. 525/329.7, 525/330.3, 330.5, 374; 428/500
See application file for complete search history.

(56) References Cited

U.S. PATENT DOCUMENTS 4,529,772 A * 7/1985 Druschke et al. ............ 524/555
2006/0188714 A1* 8/2006 Tetsumoto et al. ..... 428/355 AC

FOREIGN PATENT DOCUMENTS

JP 2003-082307 A 3/2003

* cited by examiner

*Primary Examiner*—Roberto Rábago
(74) *Attorney, Agent, or Firm*—Sughrue Mion, PLLC

(57) ABSTRACT

The purpose of the invention is to obtain a water-dispersible adhesive composition capable of coating in an aqueous system and, particularly, an adhesive composition capable of preparing a removable water-dispersible acrylic adhesive sheet with less contamination to the surface of an adherend and having high resistance to water intrusion during wafer polishing, which is particularly suitable as an adhesive sheet for use in semiconductor wafer processing. The invention relates to a water-dispersible acrylic adhesive composition, which includes an acryl emulsion polymer obtainable by an emulsion polymerization of a monomer mixture containing an alkyl (meth)acrylate ester; and a crosslinker which is a carbodiimide crosslinker or a hydrazine crosslinker, in which the acryl emulsion polymer has a glass transition temperature of from −80 to −20° C.

13 Claims, No Drawings

REMOVABLE WATER-DISPERSIBLE ACRYLIC ADHESIVE COMPOSITION AND ADHESIVE SHEET

FIELD OF THE INVENTION

The present invention relates to a removable, less-contaminating water-dispersible acrylic adhesive composition and an adhesive sheet used for surface protection or prevention of damages upon manufacture of parts to be fabricated finely such as semiconductors, circuits, various kinds of printed substrates, various kinds of masks, and lead frames. Particularly, it relates to a removable water-dispersible acrylic adhesive composition which is preferably used for an adhesive sheet for use in semiconductor wafer processing used upon rear face polishing or dicing of semiconductor wafers; and the adhesive sheet.

BACKGROUND OF THE INVENTION

Conventionally, removable adhesive sheets have been used so far for surface protection and prevention of damages during manufacture of parts to be fabricated finely such as semiconductors, circuits, various kinds of printed substrates, various kinds of masks, and lead frames. The removable adhesive sheets used for these purpose are required to be non-contamination type so that adherends are not contaminated with organic materials or particles attributable to adhesive compositions. While solvent type acrylic adhesives have been used so far for such application, since the solvent type acrylic adhesives are synthesized in organic solvents, evaporation of the solvents during coating causes an environmental problem and conversion of them to water-dispersible acrylic adhesives has been intended. However, since the water-dispersible acrylic adhesives use emulsifiers, it has been difficult to decrease contamination in comparison with the solvent type acrylic adhesives.

Particularly, in the adhesive sheet for use in semiconductor wafer processing used in the processing application of semiconductor integrated circuits, contamination-free property is important. Usually, a semiconductor integrated circuit has been manufactured by slicing, for example, silicon single crystals at high purity into wafers, incorporating an integrated circuit by etching to form a predetermined circuit pattern such as an IC to the surface of the wafer, then polishing the wafer rear face by a grinder to decrease the wafer thickness as thin as 100 to 600 µm and, finally, dicing the same into a chip. During the polishing, an adhesive sheet is bonded to the wafer surface for preventing damages of the wafer or facilitating the polishing work. Further, during the dicing, an adhesive sheet is bonded on the side of the wafer rear face and the wafer is subjected to dicing while being adhered and secured, and the formed chip is picked-up by knocking up on the side of a substrate by a needle and fixing the same on a die pad.

The adhesive sheet for use in semiconductor wafer processing used for such a purpose is required to have such an adhesive force as not to be removed during the polishing or dicing and, on the other hand, to have such a low adhesive force that it can be removed easily upon pick-up after the polishing or dicing and also it does not damage the semiconductor wafer. Further, the adhesive sheet is required not to cause adhesive residues on the wafer surface or the wafer rear face so as not to contaminate the surfaces. Particularly, along with the increase in the density and the performance of semiconductor integrated circuits in recent years, administration for the contamination to semiconductor wafers and circuit surfaces of semiconductor chips obtained therefrom has become severer. Accordingly, further less-contaminating property has been demanded to adhesive films for use in the fabrication of wafers more than even before.

Further, it has been known that contaminants on the wafer surface give undesired effects on the shear strength of a wire bonding. That is, in the wire bonding conducted upon manufacture of semiconductor chips, while it is necessary that the adhesive force between a ball and a pad is high, organic materials or particles adhered on the aluminum surface over the wafer result in a factor of inhibiting the adhesion of the gold wire to the aluminum surface, and in a case where a great amount of contaminants are deposited on the aluminum surface, they result in a problem of lowering the wire bonding shear strength.

On the other hand, unevenness such as a pattern or a dicing line is present on a wafer to be polished. The adhesive sheet is bonded to the surface of the wafer pattern having such unevenness. In a case where the adhesive sheet does not fill the unevenness on the wafer surface and voids are present, or in a case where the adhesion to the wafer surface is poor, water intrudes during polishing to result in a problem of contaminating the surface of the wafer pattern. While a removable water-dispersible acrylic adhesive sheet, which includes an adhesive layer formed of a water-dispersible adhesive with less contamination to the surface of an adherend, and is usable, particularly, as an adhesive sheet for use in semiconductor wafer processing, has already been proposed (JP-A-2003-82307), compatibility between high resistance to water intrusion and less-contaminating property has been demanded further.

SUMMARY OF THE INVENTION

In view of the foregoing problems, the present invention provides a water-dispersible acrylic adhesive composition that can be coated in an aqueous system, which can develop an appropriate adhesive force and a favorable removability upon preparing an adhesive sheet using the composition and can provide an adhesive sheet with less contamination to the surface of an adherend.

The invention also intends to provide a water-dispersible acrylic adhesive sheet excellent in the conformity to the unevenness on the surface of an adherend and the resistance to water intrusion, being removable favorably with no residue of adhesive to the adherend upon removal, causing less contamination to the surface of the adherend and, particularly, usable suitably as an adhesive sheet for use in semiconductor wafer processing.

The present inventors have made intensive studies for attaining the foregoing purpose and, as a result, have found that a water-dispersible acrylic adhesive composition giving less contamination to the surface of an adherend such as a wafer and having high resistance to water intrusion upon wafer polishing can be obtained with an adhesive composition containing an acryl emulsion polymer as a main ingredient and a carbodiimide crosslinker or a hydrazine crosslinker as a crosslinker, in which the acryl emulsion polymer satisfies predetermined conditions, and have accomplished the present invention.

DETAILED DESCRIPTION OF THE INVENTION

Namely, the invention relates to the followings.
(1) A water-dispersible acrylic adhesive composition, which comprises:
an acryl emulsion polymer obtainable by an emulsion polymerization of a monomer mixture containing an alkyl (meth)acrylate ester; and a crosslinker which is a carbodiimide crosslinker or a hydrazine crosslinker, wherein the acryl emulsion polymer has a glass transition temperature of from −80 to −20° C.

(2) The water-dispersible acrylic adhesive composition according to (1), said adhesive composition comprising a carbodiimide crosslinker as the crosslinker, and said monomer mixture containing 0.5 to 10 parts by weight of a carboxyl group-containing monomer based on 100 parts by weight of the entire monomer mixture.

(3) The water-dispersible acrylic adhesive composition according to (1), said adhesive composition comprising a hydrazine crosslinker as the crosslinker, and said monomer mixture containing 0.5 to 10 parts by weight of a carbonyl group-containing monomer based on 100 parts by weight of the entire monomer mixture.

(4) The water-dispersible acrylic adhesive composition according to (1), wherein the monomer mixture contains 1 to 15 parts by weight of a hydroxyl group-containing monomer based on 100 parts by weight of the entire monomer mixture.

(5) The water-dispersible acrylic adhesive composition according to (1), wherein when said adhesive composition is formed into a layered form to prepare an adhesive layer, said adhesive layer has, in a tensile test, an initial modulus of elasticity of from 0.20 to 1.50 MPa, a maximum strength of from 1.0 to 8.0 MPa, and a breaking elongation of from 180 to 900%, and has a gelling fraction of 90% or more.

(6) The water-dispersible acrylic adhesive composition according to (1), wherein the acryl emulsion polymer is obtainable by an emulsion polymerization with a redox type polymerization initiator.

(7) The water-dispersible acrylic adhesive composition according to (1), wherein a reactive emulsifier containing a radical polymerizable functional group is used for the preparation of the acryl emulsion polymer.

(8) The water-dispersible acrylic adhesive composition according to (1), wherein an emulsifier containing a carboxyl group or a salt thereof is used for the preparation of the acryl emulsion polymer, and wherein said adhesive composition comprises a carbodiimide crosslinker and/or a crosslinker having a functional group capable of reacting with a carboxyl group as the crosslinker.

In a case of containing the carbodiimide crosslinker as the crosslinker, the monomer mixture preferably contains a carboxyl group-containing monomer in an amount of from 0.5 to 10 parts by weight based on 100 parts by weight of the entire monomer mixture.

In a case of containing the hydrazine crosslinker as the crosslinker, the monomer mixture preferably contains a carbonyl group-containing monomer in an amount of from 0.5 to 10 parts by weight based on 100 parts by weight of the entire monomer mixture.

The monomer mixture preferably contains a hydroxyl group-containing monomer in an amount of from 1 to 15 parts by weight based on 100 parts by weight of the entire monomer mixture.

According to the water-dispersible acrylic adhesive composition, when the composition is formed into a layered state to prepare the adhesive layer, the adhesive layer preferably has an initial modulus of elasticity of from 0.20 to 1.50 MPa, a maximum strength of from 1.0 to 8.0 MPa, and a breaking elongation of from 180 to 900% in a tensile test, and the adhesive layer preferably has a gelling fraction of 90% or more.

The acryl emulsion polymer is preferably obtainable by an emulsion polymerization with a redox type polymerization initiator.

The emulsifier used for the preparation of the acryl emulsion polymer is preferably a reactive emulsifier having a radically polymerizable functional group.

It is preferred that the emulsifier used for the preparation of the acryl emulsion polymer is an emulsifier containing a carboxyl group or a salt thereof, and that a carbodiimide crosslinker and/or a crosslinker having a functional group capable of reacting with the carboxyl group is/are contained as the crosslinker.

In addition, the invention also relates to the followings.

(9) A water-dispersible acrylic adhesive sheet, which comprises:

a support; and an adhesive layer comprising the water-dispersible acrylic adhesive composition according to (1), which is disposed on the support, wherein said adhesive sheet is removable from an adherend after bonding to the adherend.

(10) The water-dispersible acrylic adhesive sheet according to (9), which is for use in semiconductor wafer processing.

The adhesive sheet can be used preferably as a water-dispersible acrylic adhesive sheet for use in semiconductor wafer processing and can be used suitably for the applications use of semiconductor wafer processing.

Since the water-dispersible acrylic adhesive composition of the invention can be manufactured and used for coating operation in an aqueous system without using an organic solvent, it is excellent in view of environmental sanitation. By using the adhesive composition of the invention, an adhesive excellent in the conformity to the unevenness of the surface of an adherend and in the resistance to water intrusion, causing no adhesive residues on the surface of the adherend and removable with scarce contamination due to organic materials upon removal after bonding to the adherend can be manufactured.

Since the water-dispersible acrylic adhesive sheet of the invention can be coated in an aqueous system and be prepared without using an organic solvent, it is excellent in view of the environmental sanitation. Further, since it can well conformed to the unevenness on the surface of an adherend upon bonding to the adherend and develops an appropriate adhesion force, it is excellent in the resistance to water intrusion. Upon removal after attaining the bonding purpose, it is removable with no adhesive residue and causes extremely less contamination to the surface of the adherend after removal. Accordingly, the water-dispersible acrylic adhesive sheet of the invention can be used suitably as an adhesive sheet for use in semiconductor wafer processing which is used particularly upon rear face polishing or dicing of semiconductor wafer and, when processing operation is conducted in the wire bonding applied during the manufacture of semiconductor chips by using the water-dispersible acrylic adhesive sheet for use in the semiconductor wafer processing according to the invention, boundary breakage is not caused between the aluminum surface and the gold wire and high shear strength can be maintained. Furthermore, taking advantage of the less contaminating property, it can be utilized generally as a removable water-dispersible acrylic adhesive sheet used for surface protection and prevention of damages for application uses in which the adhesive sheet is removed during use or after use, for example, upon manufacture of parts to be fabricated finely such as semiconductors, circuits, various kinds of printed substrates, various kinds of masks, and lead frames.

The acryl emulsion polymer, which is the main ingredient of the removal water-dispersible acrylic adhesive composition of the invention, is obtainable by an emulsion polymerization of a monomer mixture containing an alkyl (meth)acrylate ester as a main ingredient, and the glass transition temperature of the acryl emulsion polymer is −80 to −20° C.

Specific examples of the alkyl (meth)acrylate ester include methyl (meth)acrylate, ethyl (meth)acrylate, propyl (meth)acrylate, butyl (meth)acrylate, isobutyl (meth)acrylate, isoamyl (meth)acrylate, hexyl (meth)acrylate, 2-ethylhexyl (meth)acrylate, isooctyl (meth)acrylate, isononyl (meth) acrylate, and isodecyl (meth)acrylate.

The monomer mixture contains, in addition to the alkyl (meth)acrylate ester described above, a carboxyl group-containing monomer or a carbonyl group-containing monomer in an amount of from 0.5 to 10 parts by weight, preferably, from 0.5 to 7 parts by weight and more preferably, from 1 to 5 parts by weight based on 100 parts by weight of the entire monomer mixture. In a case where the carboxyl group-containing monomer or the carbonyl group-containing monomer is less than 0.5 parts by weight, the reaction sites with the carbodiimide crosslinker or the hydrazine crosslinker to be described later is decreased to increase contaminants on an adherend after removing the adhesive sheets having the adhesive layer including the composition from the adherend. Further, in a case where it is more than 10 parts by weight, the solution viscosity of the acryl emulsion polymer increases to result in a problem such as coating streaks upon forming the adhesive layer, for example, by coating the adhesive to a support or releasing liner.

The carbonyl group-containing monomer is not particularly restricted so long as it is polymerizable with the alkyl (meth)acrylate ester and contains a keto group and/or aldehyde group, and the examples thereof include diacetone acrylamide, diacetone methacrylanide, acrolein, formyl styrol, vinyl methyl ketone, vinyl ethyl ketone, vinyl isobutyl ketone, diacetone acrylate, diacetone methacrylate, acetonitrile acrylate, 2-hydroxypropylacrylate acetoacetate, and butanediol acrylate acetoacetate. Among them, diacetone acrylamide can be used suitably.

The carboxyl group-containing monomer is not particularly restricted so long as it is copolymerizable with the alkyl (meth)acrylate ester as the main monomer, and the examples thereof include acrylic acid, methacrylic acid, maleic acid, crotonic acid, acrylic acid dimer, ω-carboxy-polycaprolactone monoacrylate, and phthalic acid monohydroxyethyl acrylate. The carboxyl group-containing monomers can be used each alone or two or more of them can be used in combination.

The monomer mixture for obtaining the acryl emulsion polymer may optionally contain, in addition to the alkyl (meth)acrylic ester and the carbonyl group-containing monomer or the carboxyl group-containing monomer described above, a monomer copolymerizable with the main monomer, for the purpose of stabilizing the emulsion particles, improving the adhesion to a substrate of the adhesive layer or improving the initial adhesion to an adherend. Such a monomer may sometimes referred to as other monomer in the present specification. For the other monomer, the amount of use thereof can be selected properly in accordance with the kind of each of the monomer within the range of 60% by weight or less, preferably, 25% by weight or less, in the entire monomer mixture.

The examples of the other monomer described above include vinyl ester monomers such as vinyl acetate; styrene monomers such as styrene; epoxy group-containing monomers such as glycidyl acrylate and glycidyl methacrylate; hydroxyl group-containing monomers such as 2-hydroxyethyl (meth)acrylate, and 2-hydroxypropyl(meth)acrylate; amide group-containing monomers such as N,N-dimethylacrylamide, N,N-diethylacrylamide, and N-isopropylacrylamide; amino group-containing monomers such as acryloylmorpholine; and carbonyl group-containing monomers such as diacetone acrylamide, diacetone methacrylamide, acrolein, formylstyrol, vinyl methyl ketone, vinyl ethyl ketone, vinyl isobutyl ketone, diacetone acrylate, diacetone methacrylate, acetonitryl acrylate, 2-hydroxypropyl acrylate acetoacetate, and butanediol acrylate acetoacetate.

According to the invention, hydroxyl group-containing monomers such as 2-hydroxyethyl (meth)acrylate and 2-hydroxypropyl (meth)acrylate are used preferably as other monomer. By the use of the hydroxyl group-containing monomer, interaction of a silicone wafer is increased to cause less disadvantage that grinding water intrudes to the boundary between the wafer and the adhesive tape upon wafer grinding. The hydroxyl group-containing monomer can be used, for example, within a range of from 1 to 15 parts by weight, preferably, from 1 to 10 parts by weight and particularly preferably, from 1 to 5 parts by weight based on 100 parts by weight of the entire monomer mixture. In a case where the hydroxyl group-containing monomer is more than 15 parts by weight, the solution viscosity of the acryl emulsion polymer increases, tending to result in a problem such as coating streaks upon coating as the adhesive composition on the substrate or the releasing liner.

Upon preparation of the acryl emulsion polymer, a polyfunctional monomer (crosslinker) can be copolymerized for controlling the gelling fraction of the adhesive to be described later. The examples of the polyfunctional monomer include polyfunctional (meth)acrylates such as diethyleneglycol diacrylate, diethylene glycol dimethacrylate, ethylene glycol diacrylate, ethylene glycol dimethacrylate, tetraethylene glycol diacrylate, tetraethylene glycol dimethacrylate, neopentyl glycol diacrylate, neopentyl glycol dimethacrylate, 1,6-hexanediol diacrylate, 1,6-hexanediol dimethacrylate, trimethylol propane triacrylate, trimethylol propane trimethacrylate, pentaerythritol triacrylate, pentaerythritol trimethacrylate, dipentaerythritol hexaacrylate, and dipentaerythritol hexamethacrylate; and polyfunctional aromatic vinyl compounds such as divinylbenzene.

The kind, the combination, and the blending ratio of the alkyl (meth)acrylate ester which is the main monomer, the carbonyl group-containing monomer or the carboxyl group-containing monomer and other monomer are selected with being controlled such that the glass transition temperature of the obtained acryl emulsion polymer is from −80 to −20° C., preferably, from −75 to −22° C. and more preferably, from −70 to −30° C. In a case where the glass transition temperature is higher than −20° C., the conformity of the adhesive to the surface step of the pattern wafer is worsened to result in a disadvantage that grinding water intrudes to the boundary between the wafer and the adhesive tape during wafer grinding. Herein, glass transition temperature means such a temperature that the entire molecular motion is stronger than the interaction between the inter-portion of the molecular structure to cause a significant change in the physical property. According to the invention, the glass transition temperature is measured by using a dynamic viscoelasticity measuring apparatus manufactured by Rheometric Scientific Co., Ltd. (trade name of products "ARES") at a sample thickness of 1.5 mm, using a parallel plate having a diameter of 7.9 mm, at frequency of 1 Hz, and at a temperature elevation rate of 5° C./min and the obtained peak point for the loss of modulus of elasticity is defined as the glass transition temperature.

An acryl emulsion polymer is prepared by a usual emulsion polymerization method by adding a polymerization initiator, an emulsifier or the like to the monomer mixture described above. For the emulsion polymerization, optional method such as general collective polymerization, continuous dropping polymerization or divisional dropping polymerization can be used and the method is not particularly restricted. Further, the polymerization temperature can be selected within a range, for example, of about 5 to 100° C. in accordance with the kind and the like of the initiator to be used.

According to the invention, the acryl emulsion polymer is preferably polymerized by collective polymerization and at a low temperature (for example, 50° C. or lower preferably, 30° C. or lower) since it is particularly effective for the decrease of the contamination amount of organic materials to an adherend such as a wafer. It is estimated that since a high molecular product can be obtained easily with less low molecular weight product to decrease the organic contamination to the wafer by conducting polymerization under such conditions.

The emulsifier used for the preparation of the acryl emulsion polymers can be used by properly selecting from known emulsifiers with no particular restriction and, for example, use of a reactive emulsifier having a radical polymerizable functional group such as vinyl group, propenyl group, isopropenyl group, vinyl ether group (vinyloxy group), allyl ether group (allyloxy group) can greatly decrease contamination to the wafer. Examples of commercial products of such reactive emulsifiers include "ADEKA Soap SE-10N", trade name of products manufactured by ADEKA CORPORATION, "Aqualon HS-20", "Aqualon HS-10", "Aqualon H5-05" trade name of products manufactured by Daiichi Kogyo Seiyaku Co. Ltd. Further, use of an emulsifier containing a carboxyl group or a salt thereof and use of a crosslinker having a functional group capable of reacting with the carboxyl group to be described later as a crosslinker in combination with the hydrazine crosslinker is also effective for decreasing the contamination. The examples of the emulsifier containing the carboxyl group or the salt thereof include half esters or half amides of dicarboxylic acid such as maleic acid, itaconic acid, fumaric acid, or sulfosuccinic acid or the salts thereof. Particularly, it is effective to use a reactive emulsifier which contains a polymerizable functional group such as propenyl group or allyloxy group in the molecule and further contains a carboxyl group, for example, monopropenyl sulfosuccinate ester or monoallyl sulfosuccinate ester, and further to use a crosslinker having a functional group capable of reacting with the carboxyl group in combination with the reactive emulsifier is preferred in view of decrease in the organic contamination to the wafers. Examples of such commercial emulsifiers include "New Coal 293", "RA 5411", and "RA544" trade name of products manufactured by Nippon Nyukazai Co. Ltd.

As the emulsifier, in order to improve various properties of the adhesive composition, general emulsifiers, for example, anionic emulsifiers such as sodium lauryl sulfate, ammonium lauryl sulfate, sodium dodecylbenzene sulfonate, sodium polyoxyethylene alkyl ether sulfate, and sodium polyoxyethylene alkylphenyl ether; nonionic emulsifiers such as polyoxyethylene alkyl ether, and polyoxyethylene alkylphenyl ether may also be used in combination with the reactive emulsifier described above. In this regard, one or two or more of emulsifiers can be selected and used.

With regard to the adhesive sheet for use in semiconductor wafer processing, since impurity ions may sometimes cause a problem in particular, it is preferred to remove impurity ions and to use an emulsifier at an $SO_4^{2-}$ ion concentration of 100 μg/g or less. As a method of removing the impurity ions, an appropriate method such as an ion exchange resin method, a film separation method, a method of precipitating and filtering impurities using alcohol or the like can be used. In a case of using an anionic emulsifier as an emulsifier, use of ammonium salt emulsifier is preferred.

The amount of the emulsifier to be used can be selected within a range, for example, of about 0.1 to 5 parts by weight, preferably, from 0.5 to 3 parts by weight based on 100 parts by weight of the entire monomer mixture. In a case where the blending amount of the emulsifier exceeds 5 parts by weight, the cohesion force of the adhesive lowers to increase the amount of contamination to an adherend and it may sometimes cause also contamination due to the emulsifier per se. In a case where the blending amount of the emulsifier is less than 0.1 parts by weight, stable emulsification cannot sometimes be maintained, and therefore, any of the above cases is not preferred.

The examples of the polymerization initiator include azo type polymerization initiators such as 2,2'-azobisisobutylonitrile, 2,2'-azobis(2-amidinopropnae)dihydrochloride, and 2,2'-azobis(N,N'-dimethyleneisobutylamidine), persulfate salts such as potassium persulfate and ammonium persulfate, peroxide type polymerization initiators such as benzoylperoxide, t-butylhydroperoxide, and redox type polymerization initiators such as aqueous hydrogen peroxide in combination with ascorbic acid, aqueous hydrogen peroxide in combination with ferrous (II) salt, and persulfate salt in combination with sodium hydrogen sulfate. Among them, use of the redox type polymerization initiator is preferred since it is particularly effective to the decrease of the amount of organic contamination to an adherend such as a wafer.

While the reason is not apparent, it may be estimated to be attributable that high molecular weight products can be obtained easily with less low molecular weight ingredient by the use of the redox type polymerization initiator. Further, in a case where impurity ions cause a problem in the adhesive sheet, it is required to use an initiator which does not contain ion ingredients, and a combination, for example, of aqueous hydrogen peroxide and ascorbic acid is used suitably. Further, in a case of using the redox type polymerization initiator, the polymerization temperature is preferably 50° C. or lower and, more preferably, 30° C. or lower.

The amount of the polymerization initiator to be used is determined in accordance with the kind thereof and the kind of the acryl monomer. Usually, it is used preferably within a range from 0.001 to 0.1 parts by weight based on 100 parts by weight of the entire monomer mixture.

In the preparation of the acryl emulsion polymer, a chain transfer agent may also be used for controlling the molecular weight. While the kind of the chain transfer agent is not particularly restricted, the examples thereof include lauryl mercaptane, mercapto acetic acid, 2-mercaptoethanol, 2-ethylhexyl thioglycolate, and 2,3-dimercapto-1-propanol and one or two or more of them may be used depending on the purpose and application use thereof.

The water-dispersible acrylic adhesive composition of the invention is obtainable by blending the acryl emulsion polymer with a carbodiimide crosslinker or a hydrazine crosslinker as the crosslinker. As the carbodiimide crosslinker, those compounds having two or more carbodiimide groups can be used with no particular restriction. The carbodiimide group shows a group in which one or two hydrogen atoms are extracted from carbodiimide (HN=C=NH). Namely the carbodiimide group is described as —N=C=NH or —N=C=N—. The examples thereof include compound represented by $R^1$—N=C=N—$R^2$—N=C=N—$R^3$, in which $R^1$, $R^2$, and $R^3$ each represents a hydrocarbon group. Further, as the carbodiimide crosslinker, polymers having a carbodiimide group (polycarbodiimide) or the like can be used suitably. Polymers having a portion excellent in affinity with water, for example, an ethylene oxide (—$CH_2$—$CH_2$—O—) portion can be used particularly preferably. Examples of commercial products of polymers having a polycarbodiimide group (polycarbodiimide) usable as the carbodiimide crosslinker in the invention include "Carbodilite V-02", "Carbodilite V-02-L2", "Carbodilite V-04", "Carbodilite E-01", and "Carbodilite E-02", trade name of products manufactured by Nisshinbo Industries, Inc. The carbodiimide crosslinkers can be used each alone or two or more of them may be used in combination.

The blending amount of the carbodiimide crosslinker can be selected within a range, for example, about from 0.3 to 5 parts by weight and, preferably, from 0.5 to 3 parts by weight based on 100 parts by weight of the acryl emulsion polymer.

As the hydrazine crosslinker, polyfunctional hydrazine compound can be used. The examples thereof include saturated or unsaturated dicarboxylic acid dihydrazide with number of carbon atoms of about 2 to 16 (preferably, number of carbon atoms of about 3 to 10) such as oxalic acid dihydrazide, malonic acid dihydrazide, succinic acid dihydrazide, glutaric acid dihydrazide, adipic acid dihydrazide, sebacic acid dihydrazide, maleic acid dihydrazide, fumaric acid dihydrazide and itaconic acid dihydrazide. Examples of commercial products thereof include "Amicure VDH" and "Amicure UDH" trade name of products manufactured by Ajinomoto-Fine-Techno Co., Inc.

The blending amount of the hydrazine crosslinker can be selected within a range, for example, about from 0.1 to 5 parts by weight and, preferably, from 0.3 to 3 parts by weight based on 100 parts by weight of the acryl emulsion polymer.

By the use of the carbodiimide crosslinker or the hydrazine crosslinker, a removable water-dispersible acrylic adhesive sheet with less contamination to the surface of an adherend and having high resistance to water intrusion during wafer grinding can be obtained. While the details of the reason are not apparent, it can be estimated that both the less contaminating property and the resistance to water intrusion can be attained simultaneously because of less amount of ingredient and impurities giving effects on the contamination of the adherend and of good cross linking efficiency.

According to the invention, in addition to the carbodiimide crosslinker or the hydrazine crosslinker described above, other crosslinkers may also be used in combination. As other crosslinker, use of a crosslinker containing a functional group capable of reacting with the carboxyl group is effective to the decrease of organic contamination to the wafer in a case of using the carboxyl group-containing emulsifier in the preparation of the acryl emulsion polymer or in a case where the acryl emulsion polymer has the carboxyl group. The examples of such crosslinkers include polyfunctional epoxy crosslinker, isocyanate crosslinker, oxazoline crosslinker, and aziridine crosslinker. The polyfunction means two or higher function. Specific examples thereof include epoxy crosslinkers such as N,N,N',N'-tetraglycidyl-m-xylenediamine, 1,3-bis (N,N-glycidylaminomethyl)cyclohexane, 1,6-hexanediol glycidyl ether, polyethylene glycol diglycidyl ether, and polyglycerol polyglycidyl ether, oxazoline crosslinkers such as "EPOCROS WS-500" trade name of product manufactured by Nippon Shokubai Co.", aziridine crosslinkers such as "CHEMITITE PZ-33" trade name of product manufactured by Nippon Shokubai Co., and block isocyanate crosslinkers such as tolylene diisocyanate (block) and "Elastoron BN-69", trade name of product manufactured by Daiichi Kogyo Seiyaku Co.

One or two or more of the crosslinkers can be selected and used in such an amount that various properties, particularly, the gelling fraction when preparing the adhesive layer is within a preferred range as will be described later. Further, for controlling the gelling fraction, other crosslinkers than those described above (for example, peroxide crosslinker) may also be used properly.

According to the water-dispersible acrylic adhesive composition obtained as described above, an adhesive layer, which is prepared by forming the adhesive composition into a layered state, preferably has an initial modulus of elasticity of from 0.20 to 1.50 MPa, a maximum strength of from 1.0 to 8.0 MPa, and a breaking elongation of from 180 to 900% in a tensile test, and the adhesive layer preferably has a gelling fraction of 90% or more.

In the tensile test, the adhesive layer is formed into a cylindrical columnar shape with 0.75 $mm^2$ of cross sectional area and 30 mm of length, and a tensile test is applied to the formed product by using a tensile tester with an inter-chuck distance of 10 mm and at a tensile speed of 50 mm/min at 23° C. under 50% RH atmosphere. An initial tangential line of an elongation-stress curve is drawn, and a stress is determined at a crossing point between the tangential line and a 100%, that is, 20 mm elongation point of a specimen (crossing point with a line: elongation=20 mm) The initial modulus of elasticity is represented by the stress value per unit initial cross sectional area. The maximum strength is represented as a maximum stress value at an elongation-stress curve per unit initial cross sectional area. The breaking elongation represents the elongation when the specimen is broken in the tensile test, which is calculated as: "breaking elongation"%=("Length of specimen at break"–"Initial length of specimen (10 mm)")÷"Initial length of specimen (10 mm)"×100.

The initial modulus of elasticity of the adhesive layer is from 0.20 to 1.50 MPa, preferably, from 0.30 to 1.0 MPa. In a case where initial modulus of elasticity is less than 0.20 MPa, the adhesive of the adhesive layer in the adhesive sheet may sometimes remain on the surface of the adherend upon removal after appending the adhesive sheet on the adherend. In a case where the initial modulus of elasticity is more than 1.5 MPa, the conformity of the adhesive to the step on the surface of the pattern wafer is worsened when the adhesive sheet is used, for example, as an adhesive sheet for use in semiconductor wafer processing, to sometimes result in a disadvantage that grinding water intrudes to the boundary between the wafer and the adhesive sheet during wafer grinding. The maximum strength is from 1.0 to 8.0 MPa and, preferably, from 2.5 to 5.0 MPa. In a case where the maximum strength is less than 2.0 MPa, the adhesive sometimes remain on the surface of the adherend such as a wafer after peeling or removing the adhesive sheet from the adherend such as a wafer. In a case where the maximum strength is more than 8.0 MPa, the conformity of the adhesive to the step on the surface of the pattern wafer is worsened to sometimes result in a disadvantage that grinding water intrudes into the boundary between the wafer and the adhesive sheet during wafer grinding. The breaking elongation is from 180 to 900%, preferably, from 240 to 800%, and more preferably, from 240 to 500%. In a case where the breaking elongation exceeds 900%, the adhesive of the adhesive layer in the adhesive sheet sometimes remain on the surface of an adherend upon removal after bonding the adhesive sheet to the adherend. In a case where the breaking elongation is less than 180%, organic contamination to the surface of the adherend may frequently increase.

The gelling fraction of the adhesive layer is, preferably, 90% or more (for example, 90 to 99%) and, particularly preferably, 95% or more (for example, 95 to 99%). In a case where the gelling fraction is less than 90%, transfer of contaminants to the adherend sometimes increases. The gelling fraction represents the degree of cross linking of the adhesive. In a case where it is less than 90%, since the degree of cross linking is small, it may sometimes cause a disadvantage such as transfer of the low molecular weight ingredient or the like to the surface of the adherend, which is not preferred. The gelling fraction is determined by sampling and weighing about 0.1 g of a specimen, dipping the same in about 50 ml of ethyl acetate at a room temperature for one week, taking out a solvent insoluble fraction, weighing the same after drying at 130° C. for about one hour and by calculation as: gelling fraction (wt %)=[(specimen weight after dipping and drying)/specimen weight]×100.

Various properties such as the initial modulus of elasticity, the maximum strength, the breaking elongation, and the gelling fraction of the adhesive layer can be controlled by controlling the kind and the ratio of the monomer, the kind and the addition amount of other additives in the preparation of the acryl emulsion polymer which is the main ingredient of the adhesive composition, and by selecting the kind and the amount of the crosslinker to be blended, absence or presence of the radiation ray treatment and other treatment conditions in the preparation of the adhesive composition.

While the radiation ray treatment described above may be applied to the adhesive composition upon preparation of the composition, it may also be applied to the adhesive layer after forming the adhesive layer, for example, by coating the adhesive composition on a support. As the radiation rays, ionizing radiation rays such as α-rays, β-rays, γ-rays, neutron-rays and electron beams or UV-rays are used as the actinic energy rays. The irradiation dose of the radiation rays may be controlled such that the gelling fraction is 90% or more as described above and it is usually 2 Mrad or less, preferably, 10 Mrad or less in a case of the actinic radiation rays and usually 3,000 $mj/cm^2$ or less in a case of UV-rays. In a case where the radiation dose is excessive, it tends to cause a problem such as deterioration of a substrate, for example, in a case of applying the radiation ray treatment to the adhesive layer in a state of disposing the adhesive layer on the support. In a case of irradiating the UV-rays, the UV-rays to be used is preferably within a wavelength region from 180 to 460 nm, as a radiation source thereof, a mercury lamp, metal halide lamp, etc. can be used suitably. Further, in a case of applying the treatment of irradiating the UV-rays, a photoreaction initiator (photosensitizer) is preferably incorporated previously in the adhesive composition. The examples of the photoreaction initiator include benzoin, benzoin methylether, benzoin ethylether, dibenzyl, and benzyldimethyl ketal.

When the adhesive layer comprising the adhesive composition of the invention is disposed on a support to be formed into the shape of sheet or tape, and is optionally subjected to drying, radiation ray treatment, etc., an adhesive sheet of the invention which is removable after bonding to the adherend can be manufactured. While the thickness of the adhesive layer is not particularly restricted, it is, for example, about from 5 to 100 μm, preferably, from 10 to 40 μm. The method of disposing the adhesive layer on the support is not particularly restricted and an adhesive sheet may be manufactured by an appropriate conventional method. For example, the adhesive composition may be coated directly on the support, or it may be coated on an optional releasing liner or the like and the formed adhesive layer may be transferred on the support.

As the support, any of appropriate thin sheets can be used with no particular restriction and, for example, plastic films such as of polyolefin resin, polyester resin, vinyl chloride resin, vinyl acetate resin and polyimide resin, metal foils, or laminates thereof are used. While the thickness of the support is not particularly restricted, it can be selected, for example, within a range of about from 50 to 300 μm and, preferably, from 70 to 200 μm. The support may be those applied, on one side or both sides thereof, with an appropriate surface treatment such as a physical treatment including corona treatment and plasma treatment, or chemical treatment including treatment with an undercoating agent with an aim of improving the adhesion with the adhesive layer. Further, an appropriate intermediate layer may also be disposed between the support and the adhesive layer with an aim of increasing the adhesion area to an adherend (semiconductor wafer, etc.), improvement of conformity with the surface, and relaxation of the stress.

Further, the removable water-dispersible acrylic adhesive sheet of the invention may be in the form of a roll body and it can be wound into a rolled state in a state of protecting the adhesive layer with a releasing film. Further, in a case without using the releasing film, a back surface treatment may also be applied to the back of the adhesive sheet with a releasing treatment agent such as a silicone releasing agent or a long-chained alkyl releasing agent.

The acrylic water-dispersible adhesive sheet of the invention obtained as described above is a removable adhesive sheet which is not known so far and can be used suitably particularly as an adhesive sheet for use in semiconductor wafer processing, and the use is not restricted at all and the sheet can be used to a wide application use such as surface protection, prevention of damages, or removal of obstacles, etc. and masking upon preparing fine parts such as semiconductors, circuits, various kinds of printed substrate, various kinds of masks and lead frames.

When the adhesive composition of the invention is formed into a layer and optionally applied with drying or other treatment to prepare an adhesive layer, it conforms the unevenness on an adherend well and develops an excellent resistance to water intrusion, Further, the adhesive-layer has a favorable removability, is removable with no residue of adhesive on the adherend, as well as can be removed with no substantial residue of fine organic contamination on the adherend. Accordingly, the adhesive sheet of the invention manufactured by using the adhesive composition of the invention can be used particularly preferably to the application use where less contaminating property is required as an adhesive sheet for use in semiconductor wafer processing which is used, for example, upon rear face grinding or dicing of semiconductor wafers. By conducting fabrication operation or the like by using the water-dispersible acrylic adhesive sheet for use in semiconductor wafer processing of the invention, boundary fracture between the aluminum surface and the gold wire can be prevented to maintain high shear strength in the wire bonding conducted during manufacture of semiconductor chips. Further, taking an advantage of less contaminating property, it can be used generally as a removable water-dispersible acrylic adhesive sheet used for such application uses as requiring removal of the adhesive sheet during use or after use and application uses requiring less contaminating property, for example, used for surface protection and prevention of damages upon manufacture of various kinds of industrial materials, particularly, finely-manufactured parts such as semiconductors, circuits, various kinds of printed substrate, various kinds of masks, and lead frames.

EXAMPLE

The present invention is to be described more specifically with reference to examples but the invention is not restricted to such examples.

<Test Evaluation>

The following tests were conducted for adhesive sheets obtained in Examples and Comparative Examples. Results are shown in Table 3.

(Glass Transition Temperature)

They were measured by using a dynamic viscoelasticity measuring apparatus (trade name of products "ARES") manufactured by Rheometric Scientific Co., Ltd., at a sample thickness of about 1.5 mm, using a jig of a parallel plate with a diameter of 7.9 mm, at a frequency of 1 Hz and at a temperature elevation rate of 5° C./min, and the temperature at the peak point of the obtained loss of modulus of elasticity was defined as a glass transition temperature.

(Initial Modulus of Elasticity, Maximum Strength and Breaking Elongation)

A cylindrical columnar adhesive with 0.75 mm$^2$ cross sectional area and 30 mm length was prepared and a tensile test was conducted by a tensile tester with an inter-chuck distance of 10 mm and at a tensile speed of 50 mm/min at 23° C. under 50% RH atmosphere. An initial tangential line of an elongation-stress curve is drawn, and a stress is determined at a crossing point between the tangential line and a 100%, that is, 20 mm elongation point of a specimen (crossing point with a line; elongation=20 mm). The initial modulus of elasticity is represented by the stress value per unit initial cross sectional area. The maximum strength represents the maximum stress value of the elongation-stress curve per unit initial cross sectional area. The breaking elongation represents elongation when the specimen is broken in the tensile test and calculated as: "Breaking elongation"%=("Length of specimen at break"−"Initial length of specimen (10 mm)")÷"Initial length of specimen (10 mm)"×100.

(Gelling Fraction)

0.1 g of a specimen was sampled and weighed accurately, dipped in about 50 ml of ethyl acetate at a room temperature for one week. Then, a solvent insoluble fraction was taken out, and weighed after drying at 130° C. for about one hour, and the gelling fraction of the adhesive was calculated as: "Gelling fraction (wt %)=[(Specimen weight after dipping and drying)/specimen weight]×100.

(Organic Contamination to Wafer)

An adhesive sheet piece was bonded to an aluminum-vapor deposited wafer (12 to 13 atomic %) by a tape bonding machine ("DR 8500-II", trade name of products manufactured by Nitto Seiki Co., Ltd.) (bonding pressure: 0.25 MPa, bonding speed 2.4 m/min), left at 40° C. for one day, the sheet piece was peeled by a tape peeling machine ("HR-8500-II", trade name of products, manufactured by Nitto Seiki Co., Ltd.) (peeling speed: 8 m/min, peeling angle: 180°), and organic materials transferred on the wafer were measured by using ESCA ["mode 15400" trade name of a product manufactured by ULVAC-PHI, INC.] A wafer which is not bonded with the adhesive sheet at all was analyzed in the same manner and the amount of transfer of the organic materials was evaluated due to the increasing amount by atomic % detected by carbon atoms. The increasing amount of organic contamination to the wafer is preferably 10 atomic % or less.

(Adhesive Residue)

A tape of 20 m thickness and 2 mm width was bonded on a PI wafer to form a step of 20 μm height. An adhesive sheet piece of 20 mm width was bonded in the direction perpendicular to the step under a press-bonding load of 2 kg. After storing the sample at 60° C. for one day, it was stored and cooled at 23° C. for 2 hours. Then, the adhesive sheet piece was peeled at a peeling angle of 180° and at a tensile speed of 300 mm/min. After peeling, the state on the surface of the PI wafer was observed using an optical microscope and evaluated as "B" for those with adhesive residue being observed and as "A" with no observation, (Particle Number)

After peeling a separator in a clean room, and adhering an adhesive sheet by way of an adhesive layer thereof on a 4-inch mirror wafer and leaving at 23° C. for one hour, the adhesive sheet piece was peeled at a peeling speed 12 m/min at a peeling angle of 180° to evaluate number of particles of 0.28 μm or greater on the mirror wafer surface by a laser surface inspection apparatus ("LS-5000", trade name of product manufactured by Hitachi Denshi Engineering Co.). The number of particles is preferably 100 per 4-inch wafer or less.

(Resistance to Water Intrusion)

In a 8 inch wafer coated with polyimide at a height of 7 μm and edge rinse width of 3.5 mm, streets each of 90 μm width and 7 μm height were prepared each at 10 mm distance in the X-Y direction to prepare a sample wafer in which street lines are present in a cross-cut pattern. The wafer was applied with an oxygen plasma treatment by "JEH-O1TS", trade name of product manufactured by JEOL Ltd., under the conditions shown in the following Table 1 and PI residues on the edge rinse was removed. An adhesive sheet piece was bonded to the wafer by a tape bonding machine ("DR8500-II", trade name of product manufactured by Nitto Seiki Co., Ltd.) with a bonding pressure of 0.25 MPa and bonding speed at 2.4 m/min, left at 23° C. for one hour, then the wafer rear face was polished from the thickness of 730 μm to 250 μm by a wafer surface polishing machine ("8460" trade name of products manufactured by DISCO CORPORATION) under the conditions described in Table 2, and then the adhesive sheet piece was peeled by a tape peeling machine ("HR8500-II", manufactured by Nitto Seiki Co., Ltd.) with a peeling speed at 8 m/min and peeling angle of 180°. Traces of water intrusion into the wafer streets and periphery thereof was observed by an optical microscope to determine the ratio of area where water was intruded. They were evaluated as "B" for those with water intrusion being observed and as "A" for those with no observation.

TABLE 1

| Oxygen flow rate | 300 (sccm) |
|---|---|
| Vacuum degree | 6 (Pa) |
| RT Power | 700 (W) |
| Time | 300 (s) |

TABLE 2

|  |  | Z1 axis | Z2 axis |
|---|---|---|---|
| Rotational speed |  | 3200 rpm | 3400 rpm |
| Feed speed | P1 | 5.00 μm/min | 0.50 μm/min |
|  | P2 | 3.00 μm/min | 0.30 μm/min |
|  | P3 | 3.00 μm/min | 0.30 μm/min |

TABLE 2-continued

|  | Z1 axis | Z2 axis |
|---|---|---|
| Polishing water | 3.0 L/min | 1.0 L/min |
| Inner nozzle | 3.0 L/min | 4.0 L/min |
| Grinding stone (manufactured by DISCO Co.) | 1F-01-1-40/60-V | 1F-01-9-4/6-B-K09 |

Example 1

To a reactor equipped with a cooling tube, a nitrogen introduction tube, a thermometer and a stirrer was charged an emulsion solution obtained by emulsifying 180 parts by weight of water, 56 parts by weight of 2-ethylhexyl acrylate, 40 parts by weight of n-butyl methacrylate, 2 parts by weight of 2-hydroxyethyl methacrylate, 2 parts by weight of acrylic acid and 2 parts by weight of an emulsifier which is formed by purifying an ether sulfate type reactive nonionic-anionic surfactant ("ADEKA Soap SE-10N", trade name of products, manufactured by ADEKA CORPORATION) with alcohol precipitation and filtration, with impurity $SO_4^{2-}$ ion concentration of 560 μg/g to 70 μg/g by an emulsifying machine, and nitrogen substitution was conducted for one hour under stirring. Then, the inner bath temperature was controlled to 25° C. during polymerization. After adding 0.1 parts by weight of aqueous hydrogen peroxide (30 wt %), 1 ml of an aqueous ascorbic acid solution containing 0.05 parts by weight of ascorbic acid and 10 parts by weight of water was added to initiate polymerization. Five hours after the initiation of the polymerization, the remaining aqueous solution of ascorbic acid was dropped for 2 hours, and reaction was further proceeded and completed in 2 hours. Then, it was neutralized with a 10 wt % aqueous ammonium to prepare an acryl emulsion polymer A.

"Carbodilite V-04" manufactured by Nisshinbo Co. as a carbodiimide crosslinker was added to 100 parts by weight of the acryl emulsion polymer A in an amount of 1.5 parts by weight based on 100 parts by weight of the entire solid content of the adhesive composition to form an acrylic adhesive composition. The adhesive composition was coated on one side of a polyolefin film of 60 μm thickness, dried at 100° C. for 3 min to form an adhesive layer of 15 μm thickness, and an ethylene vinyl acetate copolymer film (135 μm thickness) applied with a surface oxidation treatment by a corona discharge method was bonded to the adhesive surface of the adhesive layer, to transfer the adhesive layer and obtain an adhesive sheet.

The adhesive layer had a glass transition temperature of −40° C., an initial modulus of elasticity of 0.35 MPa, a maximum strength of 1.2 MPa, a breaking elongation of 285% and a gelling fraction of 97%.

Example 2

The same procedures as those in Example 1 were conducted except for using the monomer as 78 parts by weight of n-butyl acrylate, 18 parts by weight of n-butyl methacrylate, 2 parts by weight of 2-hydroxyethyl methacrylate, and 2 parts by weight of acrylic acid to prepare an acrylic emulsion polymer B. Successively, an adhesive sheet was manufactured by the same procedures as those in Example 1 except for using the acrylic emulsion polymer B instead of the acrylic emulsion polymer A.

The adhesive layer had a glass transition temperature of −42° C., an initial modulus of elasticity of 0.40 MPa, a maximum strength of 1.5 MPa, a breaking elongation of 250% and a gelling fraction of 98%.

Comparative Example 1

An adhesive sheet was manufactured by conducting the same procedures as those in Example 1 except for not using the "Carbodiimide crosslinker ("Carbodilite V-04" trade name of product, manufactured by Nisshinbo Industries, Inc.).

The adhesive layer had a glass transition temperature of −40° C., an initial modulus of elasticity of 0.18 MPa, a maximum strength of 1.1 MPa, a breaking elongation of 570% and a gelling fraction of 92%.

Comparative Example 2

The same procedures as those in Example 1 were conducted except for using the monomer as 38 parts by weight of n-butyl acrylate, 58 parts by weight of n-butyl methacrylate, 2 parts by weight of 2-hydroxyethyl methacrylate, and 2 parts by weight of acrylic acid to prepare an acrylic emulsion polymer C.

An adhesive sheet was manufactured by the same procedures as those in Example 1 except for using the acrylic emulsion polymer C instead of the acrylic emulsion polymer A.

The adhesive layer had a glass transition temperature of −15° C., an initial modulus of elasticity of 2.01 MPa, a maximum strength of 6.6 MPa, a breaking elongation of 190% and a gelling fraction of 99%.

Comparative Example 3

An adhesive tape was manufactured by conducting the same procedures as those in Example 1 except for using 2 parts by weight of 1,3-bis (N,N-glycidylaminomethyl) cyclohexane ("Tetrad C", trade name of products, manufactured by Mitsubishi Gas Chemical Company, Inc.) and 0.5 parts by weight of "Epocross WS-500", trade name of products manufactured by Nippon Shokubai Co., Ltd., instead of the carbodiimide crosslinker ("Carbodilite V-04", trade name of products manufactured by Nisshinbo Industries, Inc.)

The adhesive layer had a glass transition temperature of −40° C., an initial modulus of elasticity of 1.53 MPa, a maximum strength of 2.0 MPa, a breaking elongation of 150% and a gelling fraction of 98%.

Comparative Example 4

An adhesive tape was manufactured by conducting the same procedures as those in Example 1 except for using 0.5 parts by weight of 1,3-bis (N,N-glycidylaminomethyl) cyclohexane ("Tetrad C", trade name of products, manufactured by Mitsubishi Gas Chemical Company, Inc.) instead of the carbodiimide crosslinker ("Carbodilite V-04", trade name of products manufactured by Nisshinbo Industry, Inc.).

The adhesive layer had a glass transition temperature of −40° C., an initial modulus of elasticity of 0.50 MPa, a maximum strength of 2.2 MPa, a breaking elongation of 280% and a gelling fraction of 98%.

TABLE 3

|  | Increasing amount of organic contaminant to wafer [atomic %] | Adhesive residue | Number of particle [Number per 4-inch wafer] | Resistance to water intrusion |
|---|---|---|---|---|
| Exam. 1 | 4.7 | A | 22 | A |
| Exam. 2 | 4.2 | A | 20 | A |
| Comp. Exam. 1 | 15.2 | B | 250 | A |
| Comp. Exam. 2 | 3.7 | A | 13 | B |
| Comp. Exam. 3 | 4.5 | A | 11 | B |
| Comp. Exam. 4 | 8.2 | A | 70 | A |

As apparent from the result of Table 3, it can be seen that the adhesive sheets of Example 1 and 2 were water-dispersible acrylic adhesive sheets with the increasing amount of organic contaminants to the wafer of 5 atomic % or less, the number of particles of 25 per 4-inch wafer or less, with less contamination to the surface of adherend, and with good adhesive residue and resistance to water intrusion. On the other hand, in Comparative Example 1 which is not blended with the carbodiimide crosslinker, contaminants and the number of particles to the adherend were increased and the adhesive residue was poor. Further, in Comparative Example 2 with high glass transition temperature and high initial modulus of elasticity of the adhesive, the resistance to water intrusion was low. Further, in Comparative Example 3 using the epoxy crosslinker and the oxazoline crosslinker instead of the carbodiimide crosslinker, the initial modulus of elasticity was high and the resistance to water intrusion was poor. In Comparative Example 4 using the epoxy crosslinker instead of the carbodiimide crosslinker and further decreasing the blending amount thereof to less than the blending amount thereof in Comparative Example 3, while there was no problem in the initial modulus of elasticity and the resistance to water intrusion was favorable, contaminants and the number of particles to the adherend were increased.

Example 3

To a reactor equipped with a cooling tube, a nitrogen introduction tube, a thermometer and a stirrer was charged an emulsion solution obtained by emulsifying 180 parts by weight of water, 55 parts by weight of 2-ethylhexyl acrylate, 40 parts by weight of n-butyl methacrylate, 2 parts by weight of 2-hydroxyethyl methacrylate, 2 parts by weight of acrylic acid, 1 part by weight of diacetone acrylamide, and 2 parts by weight of an emulsifier formed by purifying an ether sulfate type reactive nonionic-anionic surfactant ("ADEKA Soap SE-10N", trade name of products, manufactured by ADEKA CORPORATION) with alcohol precipitation and filtration, with impurity $SO_4^{2-}$ ion concentration of 560 µg/g to 70 µg/g by an emulsifying machine, and nitrogen substitution was conducted for one hour under stirring. Then, the inner bath temperature was controlled to 25° C. during polymerization. After adding 0.1 parts by weight of aqueous hydrogen peroxide (30 wt %), 1 ml of an aqueous ascorbic acid solution containing 0.05 parts by weight of ascorbic acid and 10 parts by weight of water was added to initiate polymerization. Five hours after the initiation of the polymerization, the remaining aqueous solution of ascorbic acid was dropped for 2 hours, and reaction was further proceeded and completed in 2 hours. Then, it was neutralized with a 10 wt % aqueous ammonium to prepare an acryl emulsion polymer D.

Adipic acid dihydrazide was added as a hydrazine crosslinker to 100 parts by weight of the acryl emulsion polymer D in an amount of 0.5 parts by weight based on 100 parts by weight of the entire solid content of the adhesive composition to form an acrylic adhesive composition. The adhesive composition was coated on one side of a polyolefin film of 60 µm thickness, dried at 100° C. for 3 min to form an adhesive layer of 15 µm thickness, and an ethylene vinyl acetate copolymer film (135 µm thickness) applied with a surface oxidation treatment by a corona discharge method was bonded to the adhesive surface of the adhesive layer, to transfer the adhesive layer and obtain an adhesive sheet.

The adhesive layer had a glass transition temperature of −40° C., an initial modulus of elasticity of 0.34 MPa, a maximum strength of 1.2 MPa, a breaking elongation of 290% and a gelling fraction of 98%.

Example 4

The same procedures as those in Example 1 were conducted except for changing the monomer as 78 parts by weight of n-butyl acrylate, 17 parts by weight of n-butyl methacrylate, 2 parts by weight of 2-hydroxyethyl methacrylate, 2 parts by weight of acrylic acid, and 1 part by weight of diacetone acrylamide to prepare an acrylic emulsion polymer E.

Successively, an adhesive sheet was manufactured by the same procedures as those in Example 3 except for using the acrylic emulsion polymer E instead of the acrylic emulsion polymer D The adhesive layer had a glass transition temperature of −42° C., an initial modulus of elasticity of 0.38 MPa, a maximum strength of 1.6 MPa, a breaking elongation of 260% and a gelling fraction of 98%.

Comparative Example 5

An adhesive sheet was manufactured by conducting the same procedures as those in Example 3 except for not using the hydrazine crosslinker (Adipic acid dihydrazide).

The adhesive layer had a glass transition temperature of −40° C., an initial modulus of elasticity of 0.19 MPa, a maximum strength of 1.1 MPa, a breaking elongation of 570% and a gelling fraction of 92%.

Comparative Example 6

The same procedures as those in Example 1 were conducted except for changing the monomer as 37 parts by weight of n-butyl acrylate, 58 parts by weight of n-butyl methacrylate, 2 parts by weight of 2-hydroxyethyl methacrylate, 2 parts by weight of acrylic acid, and 1 part by weight diacetone acrylamide to prepare an acrylic emulsion polymer F.

An adhesive sheet was manufactured by the same procedures as those in Example 3 except for using the acrylic emulsion polymer F instead of the acrylic emulsion polymer D.

The adhesive layer had a glass transition temperature of −15° C., an initial modulus of elasticity of 2.02 MPa, a maximum strength of 6.7 MPa, a breaking elongation of 185% and a gelling fraction of 99%.

Comparative Example 7

An adhesive tape was manufactured by conducting the same procedures as those in Example 1 except for using 2 parts by weight of 1,3-bis (N,N-glycidylaminomethyl) cyclohexane ("Tetrad C", trade name of product, manufactured by Mitsubishi Gas Chemical Company, Inc.) and 0.5 parts by weight of "Epocross WS-500", trade name of products manufactured by Nippon Shokubai Co., Ltd., instead of the hydrazine crosslinker (adipic acid dihydrazide).

The adhesive layer had a glass transition temperature of −40° C., an initial modulus of elasticity of 1.53 MPa, a maximum strength of 2.0 MPa, a breaking elongation of 150% and a gelling fraction of 98%.

Comparative Example 8

An adhesive tape was manufactured by conducting the same procedures as those in Example 1 except for using 0.5 parts by weight of 1,3-bis (N,N-glycidylaminomethyl) cyclohexane ("Tetrad C", trade name of product, manufactured by Mitsubishi Gas Chemical Company, Inc.) instead of the hydrazine crosslinker (adipic acid dihydrazide).

The adhesive layer had a glass transition temperature of −40° C., an initial modulus of elasticity of 0.48 MPa, a maximum strength of 2.3 MPa, a breaking elongation of 285% and a gelling fraction of 98%.

TABLE 4

| | Increasing amount of organic contaminant to wafer [atomic %] | Adhesive residue | Number of particle [Number per 4-inch wafer] | Resistance to water intrusion |
|---|---|---|---|---|
| Exam. 3 | 4.6 | A | 17 | A |
| Exam. 4 | 4.1 | A | 15 | A |
| Comp. Exam. 5 | 15.5 | B | 283 | A |
| Comp. Exam. 6 | 3.6 | A | 9 | B |
| Comp. Exam. 7 | 4.3 | A | 10 | B |
| Comp. Exam. 8 | 8.5 | A | 82 | A |

As apparent from the result of Table 4, it can be seen that the adhesive sheets of Examples 3 and 4 were water-dispersible acrylic adhesive sheets with the increasing amount of organic contaminants to the wafer of 5 atomic % or less, the number of particles of 25N per 4-inch wafer or less, with less contamination to the surface of adherend, and with good adhesive residue and resistance to water intrusion. On the other hand, in Comparative Example 5 which is not blended with the hydrazine crosslinker, contaminants and the number of particles to the adherend were increased and the adhesive residue was poor. Further, in Comparative Example 6 with high glass transition temperature and high initial modulus of elasticity of the adhesive, the resistance to water intrusion was low. Further, in Comparative Example 7 using the epoxy crosslinker and the oxazoline crosslinker instead of the hydrazine crosslinker, the initial modulus of elasticity was high and the resistance to water intrusion was poor. In Comparative Example 8 using the epoxy crosslinker instead of the hydrazine crosslinker and further decreasing the blending amount thereof to less than the blending amount thereof in Comparative Example 7, while there was no problem in the initial modulus of elasticity and the resistance to water intrusion was favorable, contaminants and the number of particles to the adherend were increased.

While the present invention has been described in detail and with reference to specific embodiments thereof, it will be apparent to one skilled in the art that various changes and modifications can be made therein without departing from the scope thereof.

This application is based on Japanese patent application No. 2005-370230 filed Dec. 22, 2005 and Japanese patent application No. 2005-374553 filed Dec. 27, 2005, the entire contents thereof being hereby incorporated by reference.

What is claimed is:

1. A water-dispersible acrylic adhesive composition, which comprises:
   an acryl emulsion polymer obtained by an emulsion polymerization of a monomer mixture containing an alkyl (meth)acrylate ester; and
   a crosslinker which is a carbodiimide crosslinker,
   wherein the acryl emulsion polymer has a glass transition temperature of from −80 to −20° C.,
   wherein said monomer mixture further contains 0.5 to 10 parts by weight of a carboxyl group-containing monomer based on 100 parts by weight of the entire monomer mixture, wherein when said adhesive composition is formed into a layered form to prepare an adhesive layer, said adhesive layer has, in tensile test, an initial modulus of elasticity of from 0.20 to 1.50 MPa, a maximum strength of from 1.0 to 8.0 MPa, and a breaking elongation of from 180 to 900%, and has a gelling fraction of 90% or more.

2. The water-dispersible acrylic adhesive composition according to claim 1, wherein the monomer mixture contains 1 to 15 parts by weight of a hydroxyl group-containing monomer based on 100 parts by weight of the entire monomer mixture.

3. The water-dispersible acrylic adhesive composition according to claim 1, wherein the acryl emulsion polymer is obtained by an emulsion polymerization with a redox type polymerization initiator.

4. The water-dispersible acrylic adhesive composition according to claim 1, wherein a reactive emulsifier containing a radical polymerizable functional group is used for the preparation of the acryl emulsion polymer.

5. The water-dispersible acrylic adhesive composition according to claim 1, wherein an emulsifier containing a carboxyl group or a salt thereof is used for the preparation of the acryl emulsion polymer, and wherein said adhesive composition further comprises a crosslinker having a functional group capable of reacting with a carboxyl group.

6. A water-dispersible acrylic adhesive sheet, which comprises:
   a support; and
   an adhesive layer comprising the water-dispersible acrylic adhesive composition according to claim 1, which is disposed on the support,
   wherein said adhesive sheet is removable from an adherend after bonding to the adherend.

7. The water-dispersible acrylic adhesive sheet according to claim 6, which is for use in semiconductor wafer processing.

8. A water-dispersible acrylic adhesive composition, which comprises:
   an acryl emulsion polymer obtained by an emulsion polymerization of a monomer mixture containing an alkyl (meth)acrylate ester; and
   a crosslinker which is a hydrazine crosslinker,
   wherein the acryl emulsion polymer has a glass transition temperature of from −80 to −20° C., and
   said monomer mixture further contains 0.5 to 10 parts by weight of a carbonyl group-containing monomer based on 100 parts by weight of the entire monomer mixture, and
   wherein when said adhesive composition is formed into a layered form to prepare an adhesive layer, said adhesive layer has, in a tensile test, an initial modulus of elasticity of from 0.20 to 1.50 MPa, a maximum strength of from 1.0 to 8.0 MPa, and a breaking elongation of from 180 to 900%, and has a gelling fraction of 90% or more.

9. The water-dispersible acrylic adhesive composition according to claim 8, wherein the acryl emulsion polymer is obtained by an emulsion polymerization with a redox type polymerization initiator.

10. The water-dispersible acrylic adhesive composition according to claim 8, wherein a reactive emulsifier containing a radical polymerizable functional group is used for the preparation of the acryl emulsion polymer.

11. The water-dispersible acrylic adhesive composition according to claim 8, wherein an emulsifier containing a carboxyl group or a salt thereof is used for the preparation of the acryl emulsion polymer, and wherein said adhesive composition further comprises a crosslinker having a functional group capable of reacting with a carboxyl group.

12. A water-dispersible acrylic adhesive sheet, which comprises:
   a support; and
   an adhesive layer comprising the water-dispersible acrylic adhesive composition according to claim 8, which is disposed on the support,
   wherein said adhesive sheet is removable from an adherend after bonding to the adherend.

13. The water-dispersible acrylic adhesive sheet according to claim 12, which is for use in semiconductor wafer processing.

* * * * *